United States Patent
Buchwald et al.

Patent Number: 5,794,136
Date of Patent: Aug. 11, 1998

[54] NOISE BLANKER AND A RADIO RECEIVER AND METHOD EMPLOYING SAME

[75] Inventors: Gregory J. Buchwald, Crystal Lake; Lawrence M. Ecklund, Wheaton, both of Ill.; Roy H. Espe, Scottsdale, Ariz.

[73] Assignee: Motorola, Inc., Schaumburg, Ill.

[21] Appl. No.: 710,890

[22] Filed: Sep. 24, 1996

[51] Int. Cl.$^6$ .................................. H04B 1/16

[52] U.S. Cl. ............ 455/334; 455/306; 455/308; 455/222

[58] Field of Search ............. 455/296, 302, 455/303, 306, 308, 334, 226.1, 67.3, 226.3, 63, 307, 283, 338, 218, 222, 223, 225; 375/345, 346, 351

[56] References Cited

U.S. PATENT DOCUMENTS

| | | | |
|---|---|---|---|
| 3,699,457 | 10/1972 | Wright | 325/479 |
| 4,607,390 | 8/1986 | Faugeron | 455/222 |
| 4,648,126 | 3/1987 | Toffolo | 455/303 |
| 4,648,127 | 3/1987 | Jongeiper | 455/303 |
| 4,856,084 | 8/1989 | Richards, Jr. | 455/223 |
| 4,910,799 | 3/1990 | Takayama | 455/306 |
| 5,212,827 | 5/1993 | Meszko et al. | 455/223 |
| 5,261,004 | 11/1993 | Manlove et al. | 455/223 |
| 5,303,415 | 4/1994 | Takayama et al. | 455/296 |
| 5,390,345 | 2/1995 | Wada et al. | 455/296 |
| 5,583,891 | 12/1996 | Espe et al. | 455/303 |

*Primary Examiner*—Edward F. Urban
*Assistant Examiner*—Marsha D. Banks-Harold
*Attorney, Agent, or Firm*—Steven G. Parmelee; Darleen J. Stockley

[57] ABSTRACT

A noise blanker (400) suitable for use with a radio receiver (500) having a track and hold unit (509) includes an impulse noise detector (401), a low pass filter (404) that is coupled to the impulse noise detector, and a first amplitude threshold detector (406) that is coupled to the output of the low pass filter and to the input of the track and hold unit. In one embodiment, this noise blanker is configured in conjunction with a radio receiver to yield a radio receiver that substantially minimizes the impact of noise impulses on resulting processed audio. In one embodiment, a second amplitude threshold detector (512) and a repetition rate threshold detector (513) are additionally utilized to allow gating of the internal signal processing paths of the radio receiver in conjunction with operation of the track and hold unit.

15 Claims, 3 Drawing Sheets

5,794,136

NOISE BLANKER AND A RADIO RECEIVER AND METHOD EMPLOYING SAME

FIELD OF THE INVENTION

This invention relates generally to noise blankers.

BACKGROUND OF THE INVENTION

Radio receivers are well understood in the art. When receiving desired radio signals, it is understood that, particularly when receiving a relatively weak signal of interest, a noise impulse can be simultaneously received. Such a noise impulse, when rendered audible by the radio receiver, can disrupt perception of the signal of interest.

One prior art solution to this problem has been to provide an impulse noise detector. A noise impulse as detected by this detector is then compared against an amplitude threshold (which threshold is typically set at greater than an amplitude that is associated with an instantaneous radio frequency envelope that has greater than one hundred percent amplitudemodulation). When the noise impulse exceeds this threshold, a gate interrupts the signal flow through the radio receiver. At the same time, a track and hold circuit tracks the received signal and holds (and outputs) that received signal for the brief period of time that the gate is open. So configured, in many instances, noise impulses will not be rendered audible and the desired output of the radio receiver will not be unduly compromised.

This configuration, however, has a number of potential disadvantages. For example, when the noise impulse is due to a much stronger broadcast source (for example, a signal that is greater than 15 db above the desired signal) and is approximately 40 kilohertz removed from the carrier of the desired signal, the above described prior art approach can actually result in a worse sounding audio signal than if no action had been taken at all. (The above numeric examples are intended to be illustrative only; the condition noted can occur over a wide range of channel spacing, from 20 kilohertz to 200 kilohertz, depending upon the relative strength of the signals). A need therefore exists for a noise blanker that will avoid this particular problem.

DESCRIPTION OF A PREFERRED EMBODIMENT

Figure 1:
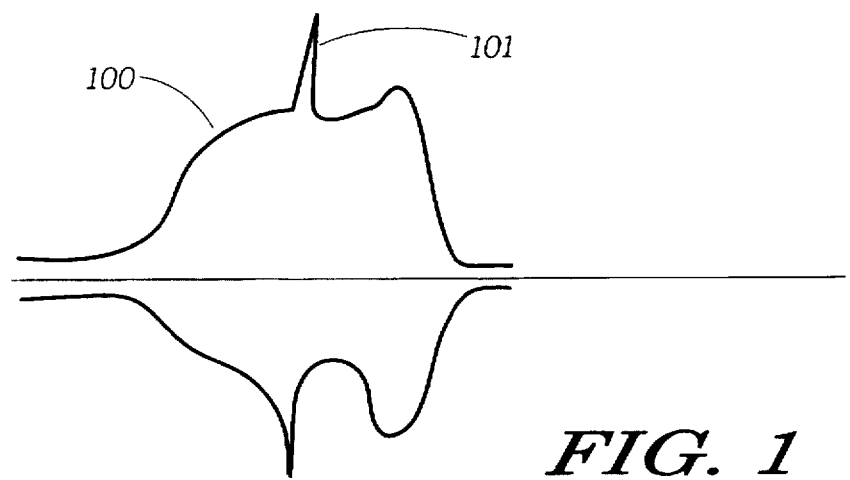
FIG. 1 comprises a simplified depiction of a desired signal as influenced by a noise impulse.
Figure 2:
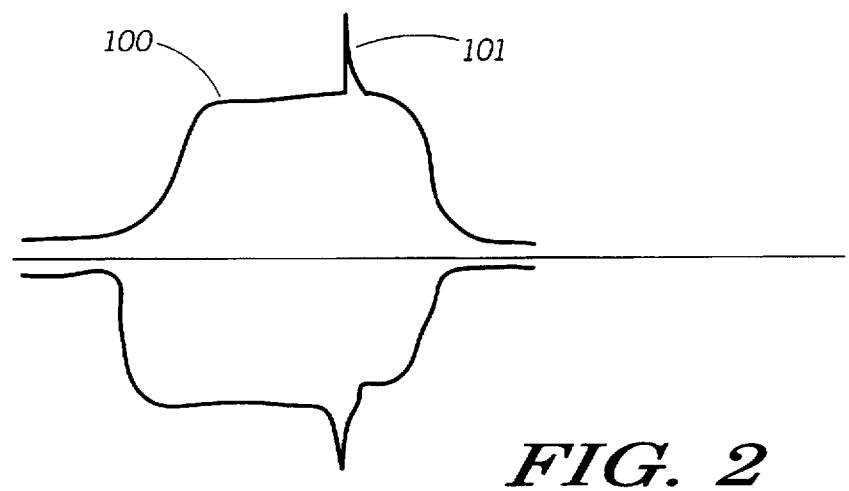
FIG. 2 comprises a simplified depiction of the same signal when the noise impulse has been processed by a noise blanker.
Figure 3:
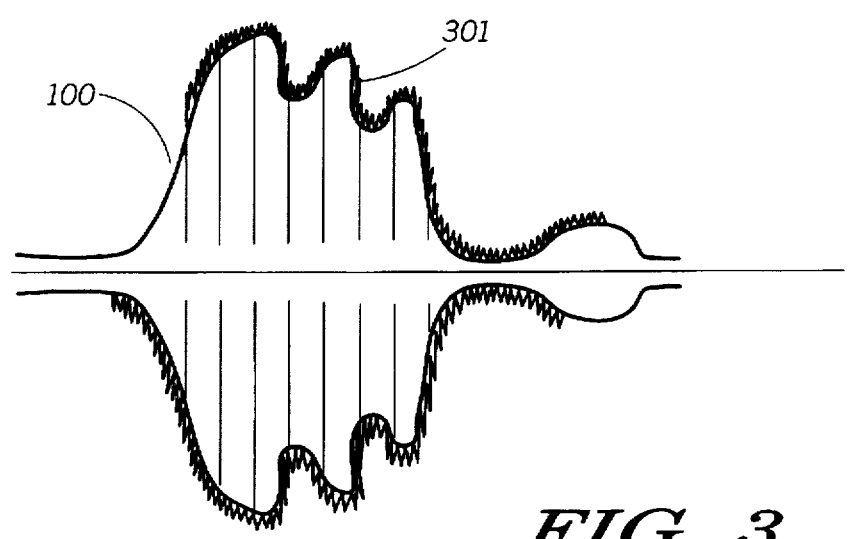
FIG. 3 comprises a simplified depiction of the same signal when the noise impulse condition has been made worse by a noise blanking operation.

Referring now to the drawings, and in particular to FIG. 1, an extremely simplified depiction of a received signal 100 is shown in conjunction with a noise impulse 101. FIG. 2 depicts this received signal 100 after helpful processing by a noise blanker. In many instances, prior art noise blanking approaches will effectively remove the noise impulse 101 as shown. Under certain conditions, however, a noise blanking action will instead cause the noise to ring as depicted by reference numeral 301 in FIG. 3. Although the overall amplitude of the noise will typically be somewhat abated, the resultant ringing introduces a temporal component that can be ultimately more objectionable than the untreated noise impulse. This is further impacted by intermodulation products that can be caused by the wide detection bandwidth of the impulse detection circuit. This generally occurs when relatively weak desired signals are simultaneously detected with strong undesired signals contained within the necessarily wideband filter resulting in multiple similar amplitude signals that have the propensity to cause "beat notes." The resulting beat note and other intermodulation products produced from envelope components of the desired and undesired signals can falsely trigger the gate circuitry and the audio track and hold. The resultant trigger signal has a noise-like component that ultimately negatively impacts the resultant detected audio output of the receiver. The embodiments described below largely avoid this problem.

Figure 4:
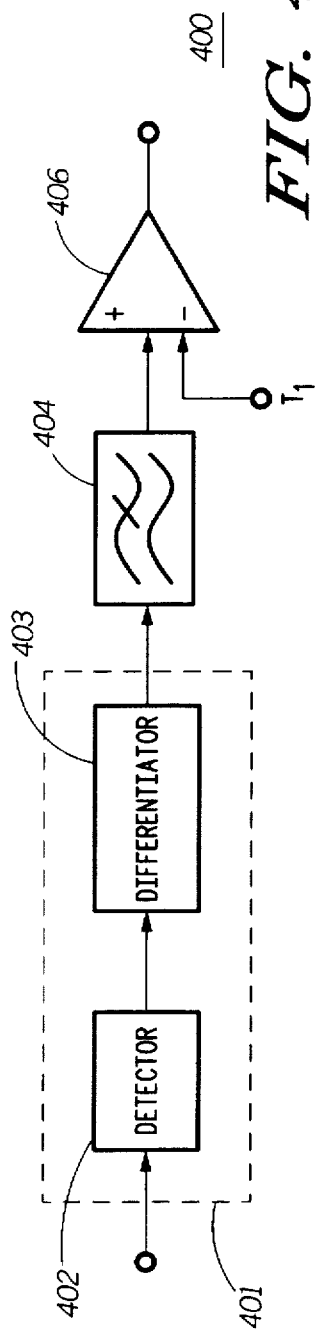
FIG. 4 comprises a block diagram depiction of a noise blanker configured in accordance with the invention.

A noise blanker 400 as configured in accordance with the invention is depicted in FIG. 4. The noise blanker 400 includes an impulse noise amplitude detector 401 that is comprised of a detector 402 (such as a diode detector) and a differentiator 403 (which may be comprised of a high pass filter). So configured, the impulse noise amplitude detector 401 will provide a signal as an output that corresponds to a noise impulse when such is present.

The output of the impulse noise amplitude detector 401 connects to the input of a low pass filter 404. In a preferred embodiment, this low pass filter includes at least two poles in accordance with well understood prior art technique. The low pass filter has, in this embodiment, a response less than a difference component as between a desired received carrier signal and an interfering received carrier signal. Further, in this embodiment, the low pass filter has a response greater than at least a highest expected on-channel modulation frequency (for example, greater than 10,000 hertz). If desired, this response could be greater than the highest expected on-channel modulation frequency that contributes energy above a predetermined threshold (for example, greater than 3500 Hz).

The output of the low pass filter 404 connects to a first amplitude threshold detector 406. This first amplitude detector 406 compares the output of the low pass filter 404 against a threshold T1. In one embodiment, this threshold T1 is set to allow detection of an amplitude that is associated with an instantaneous radio frequency envelope that has at least 100 percent or greater modulation. If desired, and depending upon the performance criteria sought this threshold could be set to detect a lower amplitude, such as 70 percent modulation.

So configured, the noise blanker 400 will detect a noise impulse, low pass filter it to minimize any beat note components, and then compare that filtered amplitude to a threshold to identify a noise impulse having sufficient amplitude to be of concern. When such is the case, the output of the first amplitude threshold detector can be coupled to a track and hold unit as described below in more detail and as otherwise understood in the art.

Figure 5:
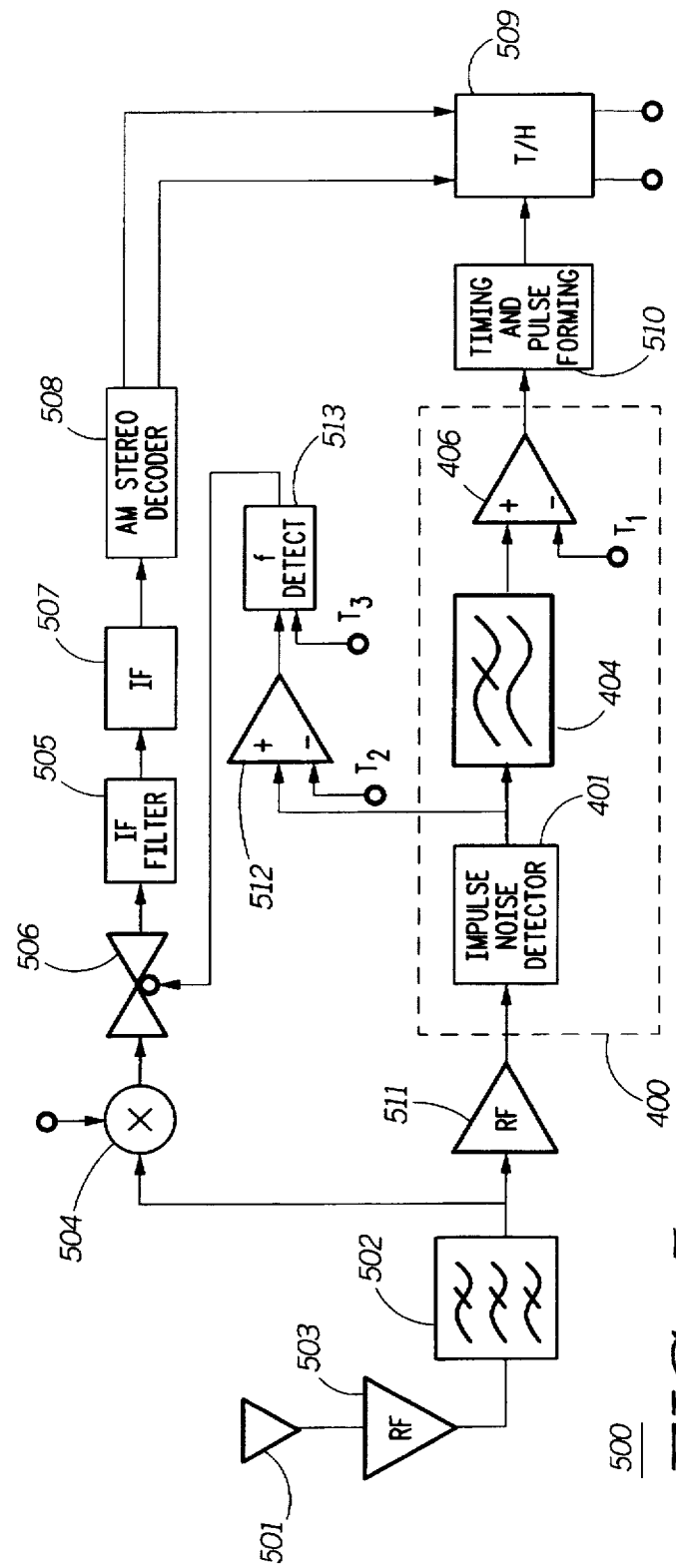
FIG. 5 comprises a block diagram depiction of a radio receiver configured in accordance with the invention.

FIG. 5 depicts a radio receiver 500 that makes use of the above described noise blanker 400, and that adds addition elements to the noise blanker.

In accordance with well understood art, an antenna 501 couples to a preselector filter 502 and to a radio frequency amplifier 503, and then to a mixer 504 and through a gate 506 (comprised, for example, by a standard gate, a gated attenuator, a limiter, or other like device) to an intermediate frequency filter 505 and an intermediate frequency stage 507. The gated envelope signal provided by the intermediate frequency stage 507 is then coupled to an AM stereo decoder 508 (the embodiment depicted comprises an AM stereo radio receiver; the application of the noise blanking concepts can be utilized in other receiver types, however, including frequency modulation receivers and monaural amplitude modulation receivers). The left and right audio outputs of the AM stereo decoder 508 are then coupled to a track and hold unit 509, the outputs of which couple to audio processing stages that are well known in the art and need not be described here. So configured, a broadcast station of interest can be selected, demodulated, decoded, and provided to an audio processing stage. When the above described gate 506 is open, however, subsequent processing of a received signal cannot be undertaken. Control of this gate 506 will be explained below.

The output of the radio receiver preselector filter 502 also couples to an additional radio frequency amplifier 511. The output of this stage 511 connects to the noise blanker 400 as described above. The output of the noise blanker 400 supplies a trigger pulse to a timing and pulse forming circuit 510, which in turn connects to the control input of the track and hold unit 509 such that operation of the track and hold unit 509 depends upon the noise blanker 400. The output of the impulse noise amplitude detector 401 also connects to a second amplitude threshold detector 512. This second amplitude threshold detector has a threshold T2 that is set to detect an amplitude that is associated with an instantaneous radio frequency envelope that has greater than 100% equivalent modulation. The output of this second amplitude threshold detector 512 couples to the input of a repetition rate threshold detector 513. The output of the repetition rate threshold detector 513 connects to the control input of the gate 506. The threshold T3 of the repetition rate threshold detector is selected such that it triggers the audio track and hold circuit when the modulated envelope exceeds at least 70% and generally 125%, and when the repetition rate is less than about 2000 impulses per second.

So configured, the second amplitude threshold detector and repetition rate threshold detector operate to control the gate 506. The second amplitude threshold detector determines whether the impulse noise amplitude detector 401 has detected a noise impulse of sufficient magnitude to be of concern. The repetition rate threshold detector 513 then ascertains whether this noise impulse has a repetition rate such that, if the gate 506 is closed in order to attempt to minimize the impact of the noise impulse, the situation will in fact become worse as depicted above in FIG. 3. If the noise impulse is of both sufficient magnitude and of low repetition rate, then the gate 506 will be opened until the noise impulse has concluded. With the gate 506 open, of course, further processing of the signal will be momentarily interrupted.

Figure 6:
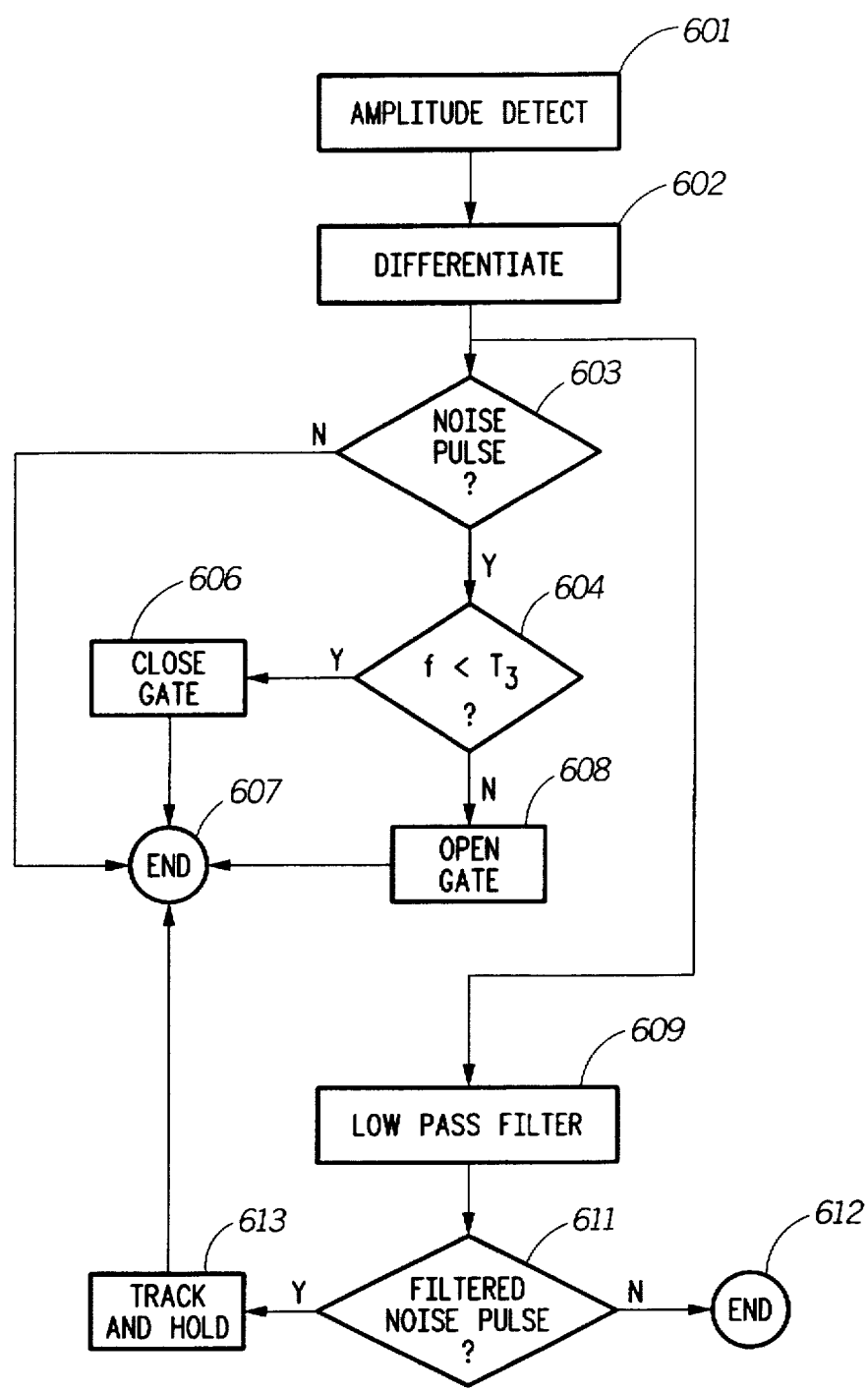
FIG. 6 comprises a flow diagram depicting operation of a noise blanker configured in accordance with the invention.

With the above configuration in mind, overall operation of an embodiment operating in accordance with the invention will be described with reference to FIG. 6. The received signal is subjected to continuous amplitude detection 601. The resultant amplitude detected signal is then differentiated 602 to remove normal desired modulation and to thereby identify the presence of a noise pulse 603. When a noise pulse has been so detected (which step can include the step of comparing the amplitude of the noise impulse against the threshold T2 in the second amplitude threshold detector), a determination is made as to whether the repetition rate of the noise impulse is less than threshold T3 604. If so, the gate is opened 608 to prevent much of the noise impulse from proceeding further through the radio receiver. Otherwise, the gate remains closed 606.

The differentiated noise impulses are also low pass filtered 609 and then a determination made as to whether the filtered noise pulse has sufficient amplitude to present a concern 611. If not, the process can conclude 612. If, however, the filtered noise pulse does present a concern, the audio output of the decoder will be tracked and held 613 to maintain the output of an acceptable signal.

So configured, the above described embodiments of a noise blanker function in cooperation with the components of the radio receiver 500 to substantially insure that all noise impulses, including those caused by relatively strong broadcast stations that are spaced approximately 20 kilohertz or more from the broadcast signal of interest, do not result in subjectively objectionable noise at the audio output of the receiver.

A further enhancement to this embodiment would be to add a repetition rate limiter (similar to the repetition rate threshold detector 513) between the timing and pulse forming circuit 510 (or made a part thereof) and the control input of the track and hold unit 509. This would prevent undesired blanking on lower frequency beat notes (for example 10 KHz).

What is claimed is:

1. A radio receiver having:
   A) a track and hold unit having a control input and a signal input;
   B) an impulse noise detector having an output;
   C) a low pass filter having an input coupled to the output of the impulse noise detector and an output;
   D) a first amplitude threshold detector having an input operably coupled to the output of the low pass filter and an output operably coupled to the control input of the track and hold unit.

2. The radio receiver of claim 1, and further comprising:
   F) a repetition rate threshold detector having an input coupled to the output of the second amplitude threshold detector and an output.

3. The radio receiver of claim 2, and further comprising:
   G) a gate having a signal output operably coupled to the signal input of the track and hold unit and a control input operably coupled to the output of the repetition rate threshold detector.

4. The radio receiver of claim 1, wherein the low pass filter has a response less than a difference component as between a desired received carrier signal and an interfering received carrier signal.

5. The radio receiver of claim 4, wherein the low pass filter further has a response greater than at least a highest expected on-channel modulation frequency.

6. The radio receiver of claim 5, wherein the low pass filter has a response greater than 10,000 Hertz.

7. The radio receiver of claim 4, wherein the low pass filter further has a response greater than any expected on-channel modulation frequency.

8. The radio receiver of claim 7, wherein the low pass filter has a response greater than 3,500 Hertz.

9. The radio receiver of claim 1 wherein the low pass filter includes at least 2 poles.

10. The radio receiver of claim 1, wherein the first amplitude threshold detector has a threshold that is set to detect an amplitude that is associated with an instantaneous radio frequency envelope that has greater than 100% amplitude modulation.

11. The radio receiver of claim 1, wherein the first amplitude threshold detector has a threshold that is set to detect an amplitude that is associated with an instantaneous radio frequency envelope that has at least 100% amplitude modulation.

12. The radio receiver of claim 1, wherein the first amplitude threshold detector has a threshold that is set to detect an amplitude that is associated with an instantaneous radio frequency envelope that has at least 70% amplitude modulation.

13. A radio receiver having:

A) a track and hold unit having a control input and a signal input;

B) an impulse noise detector having an output;

C) a low pass filter having an input coupled to the output of the impulse noise detector and an output;

D) a first amplitude threshold detector having an input operably coupled to the output of the low pass filter and an output operably coupled to the control input of the track and hold unit;

E) a second amplitude threshold detector having an input coupled to the output of the impulse noise detector and an output;

F) a repetition rate threshold detector having an input coupled to the output of the second amplitude threshold detector and an output;

G) a gate having a signal output operably coupled to the signal input of the track and hold unit and a control input operably coupled to the output of the repetition rate threshold detector.

14. A method, comprising the steps of:

amplitude detecting a radio frequency signal to provide a detected signal;

differentiating the detected signal to remove at least some audio components while substantially passing at least one noise impulse having an amplitude and a repetition rate;

comparing the amplitude of the noise impulse against a first amplitude threshold level to identify the noise impulse;

in response to identifying the noise impulse, comparing the repetition rate of the noise impulse against a repetition rate threshold level;

when the repetition rate of the noise impulse is less than the repetition rate threshold level, taking a first predetermined action;

when the repetition rate of the noise impulse is greater than the repetition rate threshold level, taking a second predetermined action, which second predetermined action is different from the first predetermined action;

low pass filtering the noise impulse to provide a filtered noise impulse having an amplitude;

comparing the amplitude of the filtered noise impulse against a second amplitude threshold level to identify a filtered noise impulse;

tracking and holding a signal that derives from the radio frequency signal in response to the filtered noise impulse.

15. A noise blanker for use with a radio receiver having a track and hold unit, the noise blanker comprising:

A) an impulse noise detector having an output;

B) a low pass filter having an input coupled to the output of the impulse noise detector and an output;

C) a first amplitude threshold detector having an input operably coupled to the output of the low pass filter and an output operably coupled to the control input of the track and hold unit.

* * * * *